(12) United States Patent
Stonebraker

(10) Patent No.: US 11,017,970 B2
(45) Date of Patent: May 25, 2021

(54) CIRCUIT TESTING SYSTEM AND METHOD OF OPERATION

(71) Applicant: Stephen E. Stonebraker, Malvern, OH (US)

(72) Inventor: Stephen E. Stonebraker, Malvern, OH (US)

(*) Notice: Subject to any disclaimer, the term of this patent is extended or adjusted under 35 U.S.C. 154(b) by 159 days.

(21) Appl. No.: 16/297,101

(22) Filed: Mar. 8, 2019

(65) Prior Publication Data
US 2019/0279833 A1 Sep. 12, 2019

Related U.S. Application Data

(60) Provisional application No. 62/640,821, filed on Mar. 9, 2018.

(51) Int. Cl.
| | | |
|---|---|---|
| *H01H 83/04* | (2006.01) | |
| *H01H 71/10* | (2006.01) | |
| *H01R 27/02* | (2006.01) | |
| *H01R 24/60* | (2011.01) | |
| *H01R 24/28* | (2011.01) | |

(52) U.S. Cl.
CPC ............ *H01H 83/04* (2013.01); *H01H 71/10* (2013.01); *H01R 24/28* (2013.01); *H01R 24/60* (2013.01); *H01R 27/02* (2013.01)

(58) Field of Classification Search
USPC .................................................. 324/424, 537
See application file for complete search history.

(56) References Cited

U.S. PATENT DOCUMENTS

| | | | | |
|---|---|---|---|---|
| 2008/0082276 A1* | 4/2008 | Rivers | ................. | G01R 22/063 702/62 |
| 2009/0033336 A1* | 2/2009 | Blanchard | .............. | G01R 27/32 324/537 |
| 2013/0021163 A1* | 1/2013 | Watford | ................. | H01H 9/168 340/638 |
| 2013/0329331 A1* | 12/2013 | Erger | ..................... | H01H 9/168 361/102 |
| 2016/0274168 A1* | 9/2016 | Cabot | .................... | G01R 31/52 |

FOREIGN PATENT DOCUMENTS

| | | |
|---|---|---|
| WO | 2018134649 | 7/2018 |
| WO | 2018142381 | 8/2018 |

\* cited by examiner

*Primary Examiner* — Vincent Q Nguyen
(74) *Attorney, Agent, or Firm* — Sand, Sebolt & Wernow Co., LPA

(57) ABSTRACT

A circuit testing system for identifying a circuit breaker associated with an electrical circuit is disclosed. The circuit testing system includes a circuit testing module and a connector mechanism provided on the circuit testing module. The connector mechanism is adapted to operably engage the circuit testing module with an electrical connection point of the electrical circuit. The circuit testing system further includes a remote electronic device wirelessly connected to circuit testing module. The connector mechanism is one of one or more prongs, a socket, and a probe; and the one of the one or more prongs, the socket, and the probe operably engages the circuit testing module to the electrical connection point.

7 Claims, 11 Drawing Sheets

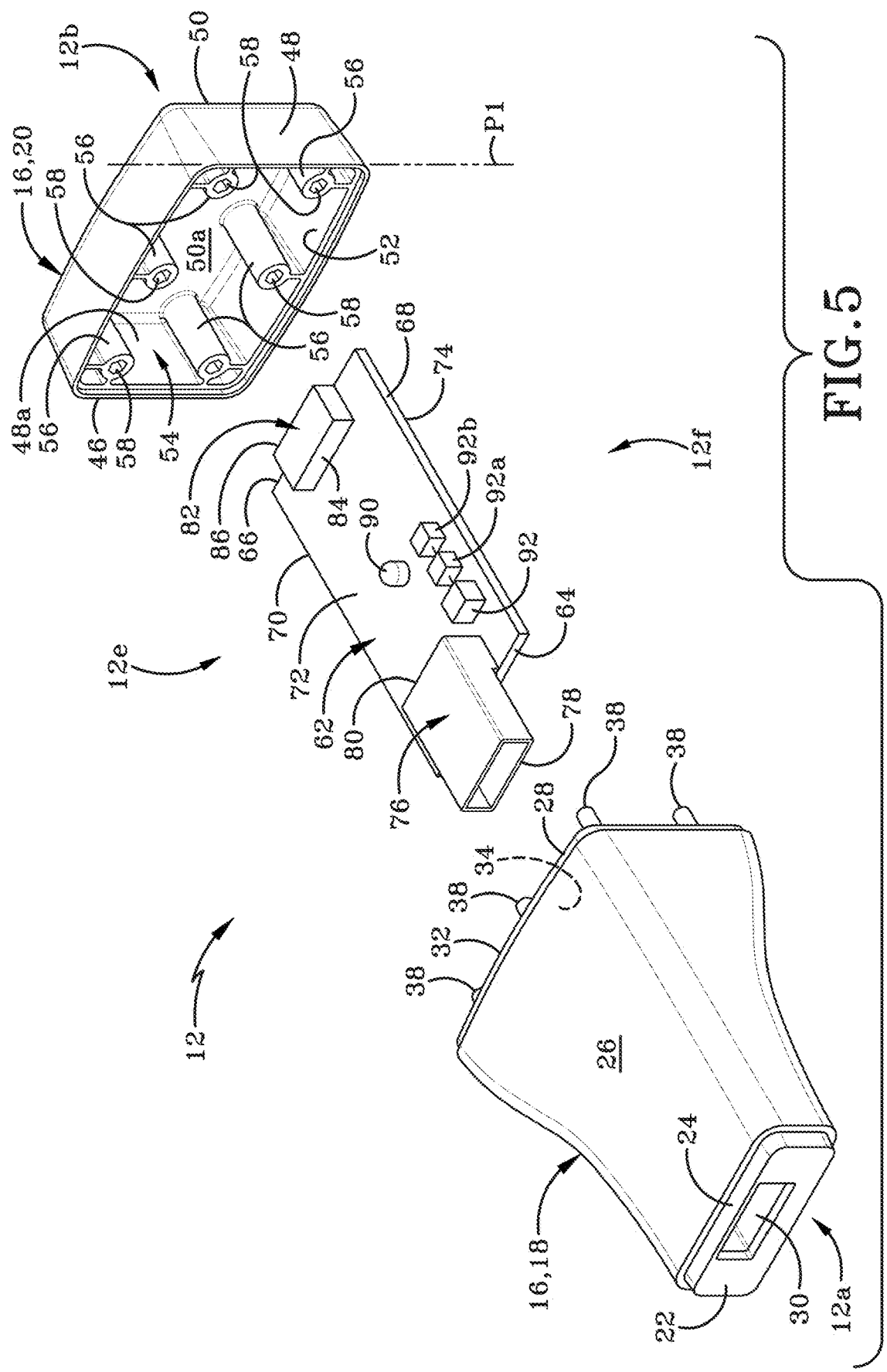

CIRCUIT TESTING SYSTEM AND METHOD OF OPERATION

BACKGROUND

Technical Field

This disclosure is generally directed to electrical testing devices. More particularly, this disclosure relates to electrical testing devices utilized to determine whether electrical circuits are energized or non-energized. Specifically, this disclosure is directed to a wireless circuit testing system and a method for testing energized and non-energized electrical circuits to identify which circuit breakers control particular electrical circuits.

Background Information

An electrical panel is a component of an electricity supply system that divides an electrical power feed into subsidiary circuits. The electrical panel is a common enclosure that houses a protective circuit breaker for each circuit in the electrical system. The electricity in each circuit typically flows from a circuit breaker to an electrical connection point, such as a standard electrical outlet or light receptacle, and then flows back to the electrical panel. Since the electricity in a building is distributed via separate circuits, each separate circuit controls one or more separate electrical connection points. For example, a first circuit protected by a first circuit breaker may power an appliance located in a kitchen of a house and a separate second circuit protected by a second circuit breaker may control an appliance in a utility room of the house.

If a circuit breaker in the electrical panel is in a closed position, then electricity will flow through the associated circuit and will energize the electrical connection points operatively engaged with that particular circuit. If a circuit breaker in the electrical panel is in an open position, then electricity will not flow through the associated circuit and, consequently, none of the electrical connection points associated with that particular circuit will be energized. Moving circuit breakers between the closed position and the open position is simply a matter of moving a switch in the electrical panel in a first direction or in a second direction.

In the event a person needs to perform electrical work related to a particular circuit, the person has to shut off power to that circuit by turning off (or opening) the circuit breaker associated with the particular circuit. The problem is that circuits are not often identified by name at the electrical panel. It can therefore be quite difficult to determine which circuit breaker controls any particular circuit. In order to determine which circuit breaker in the electrical panel controls a particular circuit, the person has to sequentially open and close some or all of the circuit breakers on the electrical panel to find the particular circuit breaker they need. This can be accomplished by energizing the circuit the person needs (e.g. switching on a light associated with the particular circuit) and then opening a first circuit breaker on the electrical panel. The person will then need to move to the room in which they previously turned the light on to see if the light has gone off. If the light has not gone off, the person will return to the electrical panel, close the first circuit breaker, open a second circuit breaker, return to the room with the light and check if the light is on or off. This procedure will need to be repeated until the person returns to the room to find the light off. At that point, the person knows they have found the circuit breaker associated with the circuit they wish to perform electrical work on. Having to repeatedly move from the electrical panel to a remote room to check whether or not a particular circuit is energized or non-energized (e.g. checking to see whether the light is on or off) is a time consuming and laborious task as the electrical panel is usually located far away from where the circuit is providing power.

One way to get around this problem is to utilize an additional person to aid in the task. A first person will be located near the particular circuit that is energized (e.g. the person will stand in the room where a light has been turned on) and the other person will be located at the electrical panel turning circuit breakers off and on until the other person relays that the particular circuit is no longer receiving power (e.g. that the light is off). Although this may save time, another person may not always be available and utilizing another person may be more expensive than performing the task with one person.

SUMMARY

The present inventor has recognized that it would be advantageous to provide a circuit testing system operable by a single user and which would allow a user to identify a circuit breaker associated with a particular electrical circuit. The present inventor has further recognized that it would be advantageous to allow the user to test an electrical circuit and identify a circuit breaker associated with a remote electrical circuit from an area located proximate the electrical panel in which the circuit breaker is housed.

In one aspect, the present disclosure may provide a circuit testing system for identifying a circuit breaker associated with an electrical circuit, wherein the circuit testing system comprises a circuit testing module; and a connector mechanism provided on the circuit testing module, said connector mechanism being adapted to operably engage the circuit testing module with an electrical connection point of the electrical circuit. The circuit testing system further includes a remote electronic device wirelessly connected to circuit testing module. In one example, the connector mechanism is one of one or more prongs, a socket, and a probe; and the one of the one or more prongs, the socket, and the probe operably engages the circuit testing module to the electrical connection point. In another example the connector mechanism is an adapter that is operably engaged with the circuit testing module and the adapter includes a Universal Serial Bus (USB) port and the circuit testing module includes a USB connector and the USB connector is receivable in the USB port.

In yet another example, the connector mechanism is an adapter having prongs; and wherein the circuit testing system further includes an accessory having a first region adapted to operably engage the accessory to the electrical connection point and a second region that receives the prongs of the adapter. In this example, the adapter may include a Universal Serial Bus (USB) port and the circuit testing module includes a USB connector and the USB connector is receivable in the USB port. In one example, the accessory is a socket adapter. In another example, the accessory is a probe.

The circuit testing system further includes an indicator provided on the circuit testing module, the indicator being adapted to alert a user that the electrical circuit is one of energized and non-energized. In one example, the indicator is a light emitting diode (LED). The circuit testing module further includes a communications device that wirelessly connects the circuit testing module to a remote electronic device. The circuit testing system further includes notification indicia generated by the circuit testing module when the electrical circuit is one of energized and non-energized.

In another aspect, the present disclosure may provide a method of identifying a circuit breaker associated with an electrical circuit. The method includes providing a circuit testing system including a circuit testing module and operably engaging the circuit testing module with an electrical connection point of an electrical circuit. The electrical circuit includes one of a plurality of circuit breakers provided in an electrical panel. The method includes determining that the electrical circuit is energized, wirelessly linking the circuit testing module with a remote electronic device, wirelessly sending notification indicia from the circuit testing module to the remote electronic device that indicates that the electrical circuit is energized, sequentially turning off each circuit breaker of the plurality of circuit breakers until the notification indicia sent from the circuit testing module to the remote electronic device indicates that the electrical circuit is non-energized, and identifying the circuit breaker associated with the electrical connection point as the circuit breaker that is turned off when the electrical circuit is non-energized.

In one example, the method further includes operably engaging a Universal Serial Bus (USB) adapter to the module, and operably engaging the USB adapter to the electrical connection point. In another example, the method further includes operably engaging a Universal Serial Bus (USB) adapter to the circuit testing module, operably engaging an accessory to the USB adapter, and operably engaging the accessory to the electrical connection point. The method further includes activating an indicator on the circuit testing system when the electrical circuit is energized. The method further includes deactivating the indicator on the circuit testing system when the electric circuit is non-energized. The method further includes opening a webpage of the circuit testing system on the remote electronic device and displaying the notification indicia on the webpage. The method further includes providing a wireless network connection from the circuit testing module, wirelessly linking the remote electronic device to the wireless network connection, entering a web address, which is a Uniform Resource Locator (URL), on the remote electronic device, opening a web page linked to the web address, and receiving the notification indicia on the web page.

In another aspect, the present disclosure may provide a circuit testing system for identifying a circuit breaker associated with an electrical circuit. The circuit testing system includes a circuit testing module and a connector mechanism provided on the circuit testing module. The connector mechanism is adapted to operably engage the circuit testing module with an electrical connection point of the electrical circuit. The circuit testing system further includes a remote electronic device wirelessly connected to circuit testing module. The connector mechanism is one of one or more prongs, a socket, and a probe; and the one of the one or more prongs, the socket, and the probe operably engages the circuit testing module to the electrical connection point.

BRIEF DESCRIPTION OF THE SEVERAL VIEWS OF THE DRAWINGS

A sample embodiment of the disclosure is set forth in the following description, is shown in the drawings and is particularly and distinctly pointed out and set forth in the appended claims. The accompanying drawings, which are fully incorporated herein and constitute a part of the specification, illustrate various examples, methods, and other example embodiments of various aspects of the disclosure. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

FIG. 5 is an exploded perspective view of the circuit testing module showing a printed circuit board (PCB) that is utilized therewith;

Similar numbers refer to similar parts throughout the drawings.

DETAILED DESCRIPTION

Referring to FIGS. 1-8, there is shown a circuit testing system for identifying a circuit breaker associated with an electrical circuit in accordance with one aspect of the present disclosure, with the circuit testing system generally indicated at 10.

Figure 1:
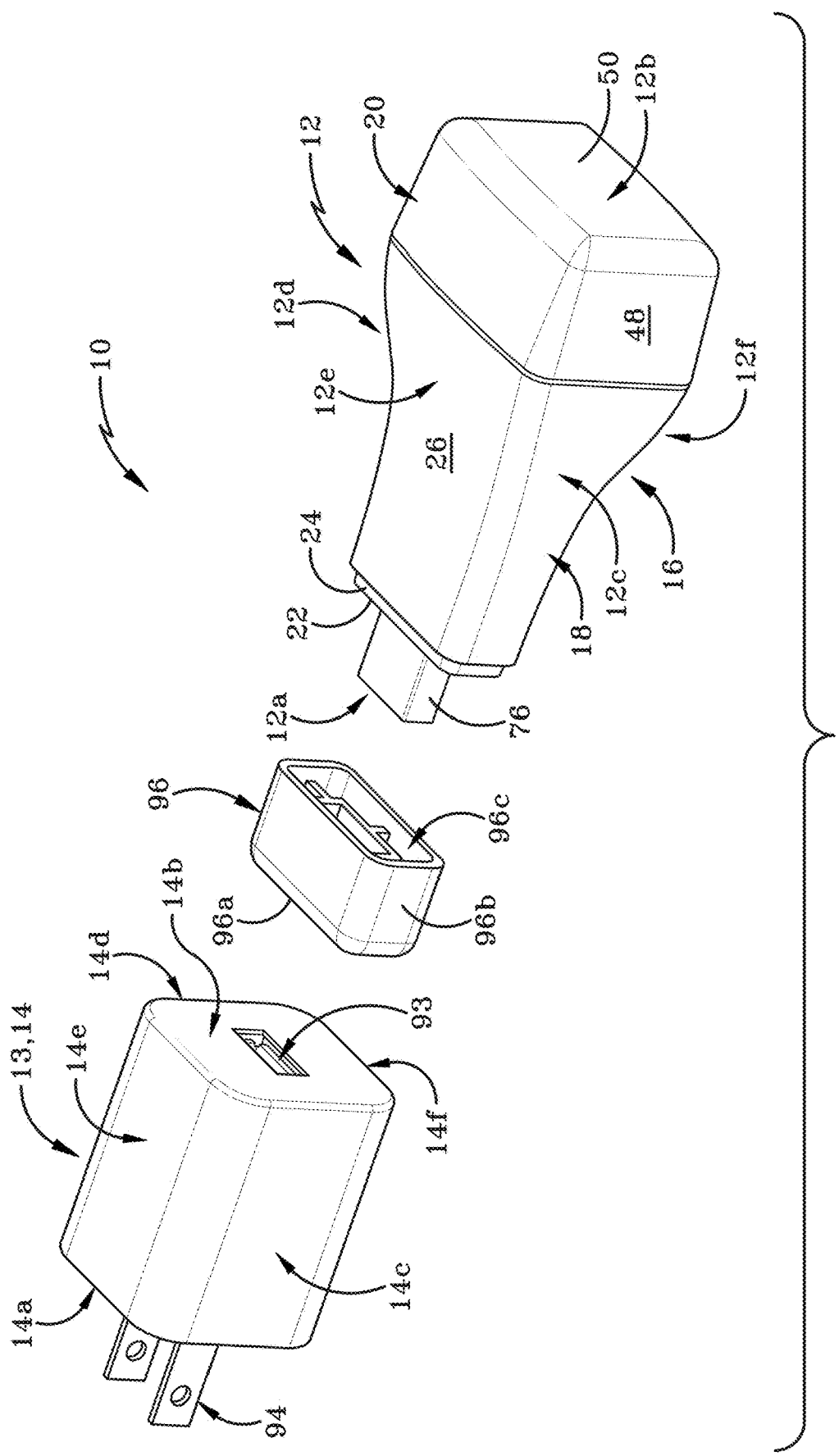
FIG. 1 is an exploded perspective of a circuit testing system including a circuit testing module, a Universal Serial Bus (USB) adapter and a cap.
Figure 2:
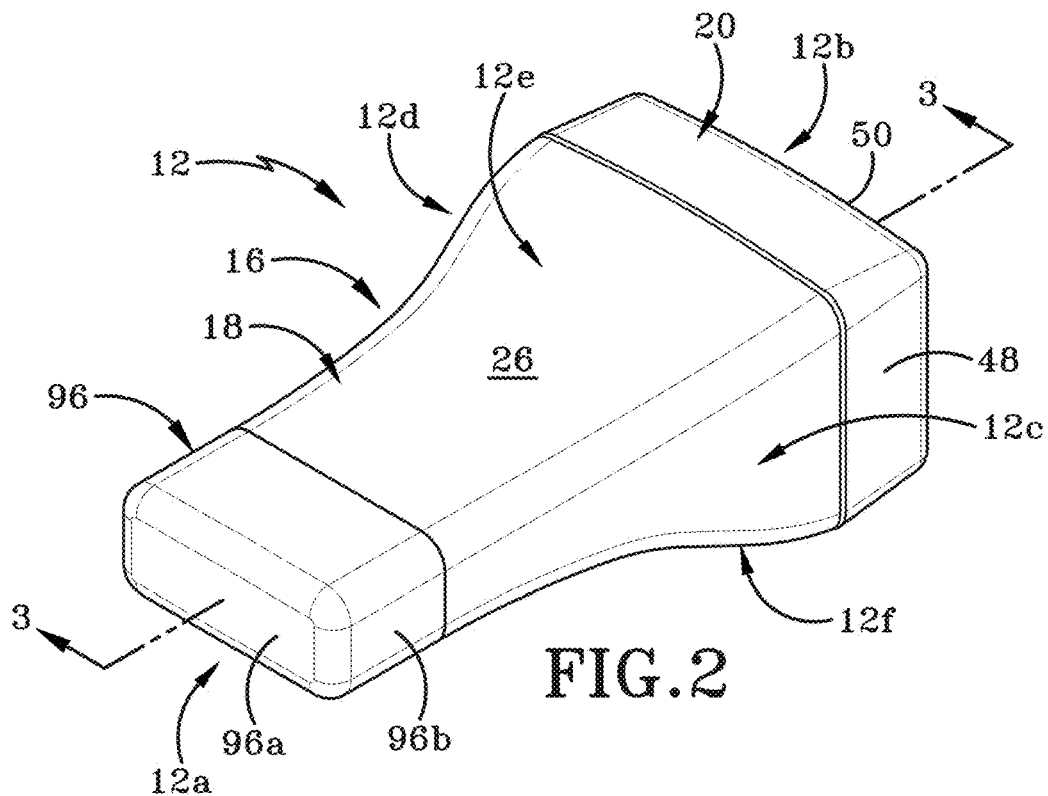
FIG. 2 is a perspective view of the circuit testing module and cap of FIG. 1 with the cap in a closed position.
Figure 4:
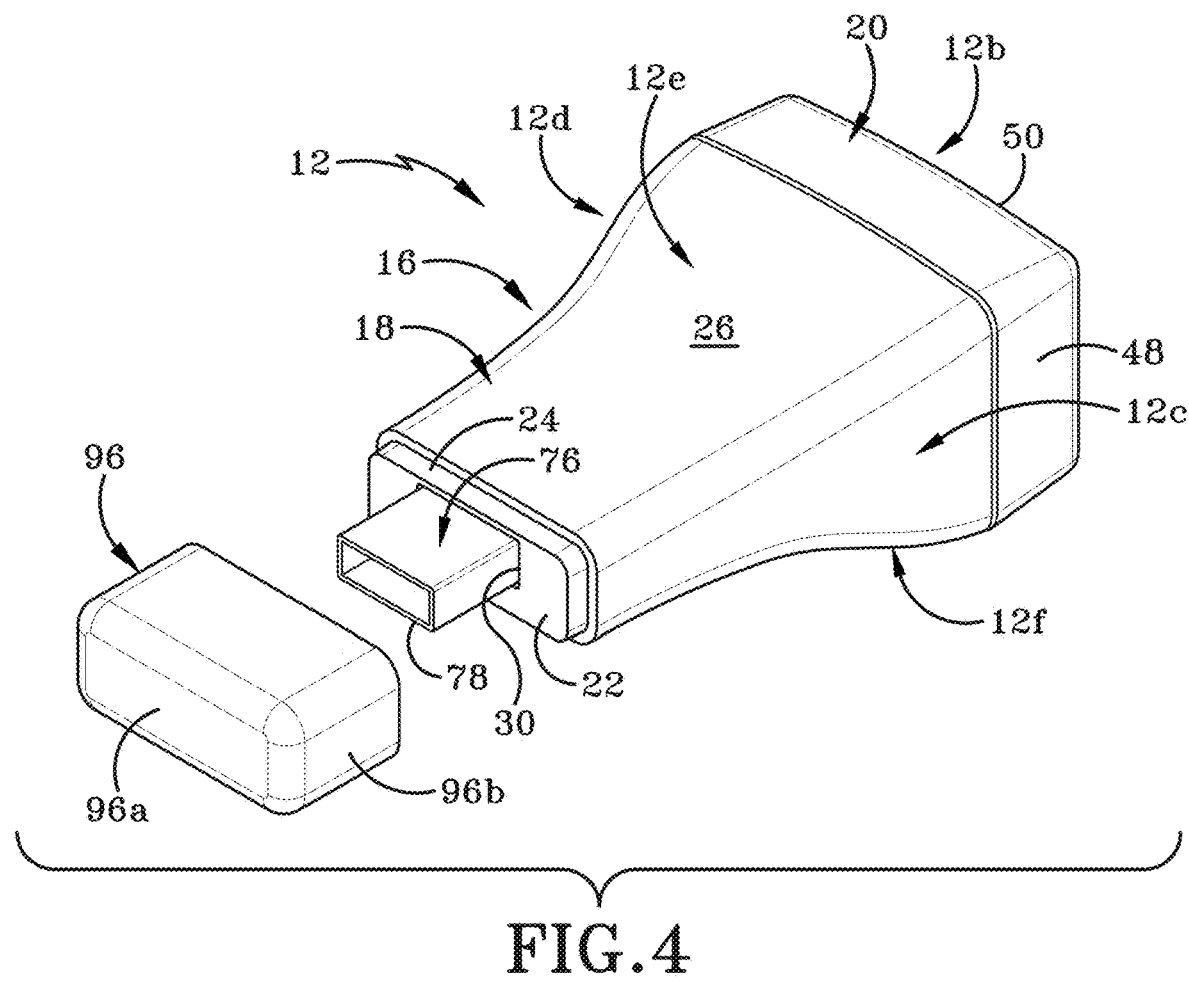
FIG. 4 is an exploded perspective view of the circuit testing module and the cap.
Figure 3:
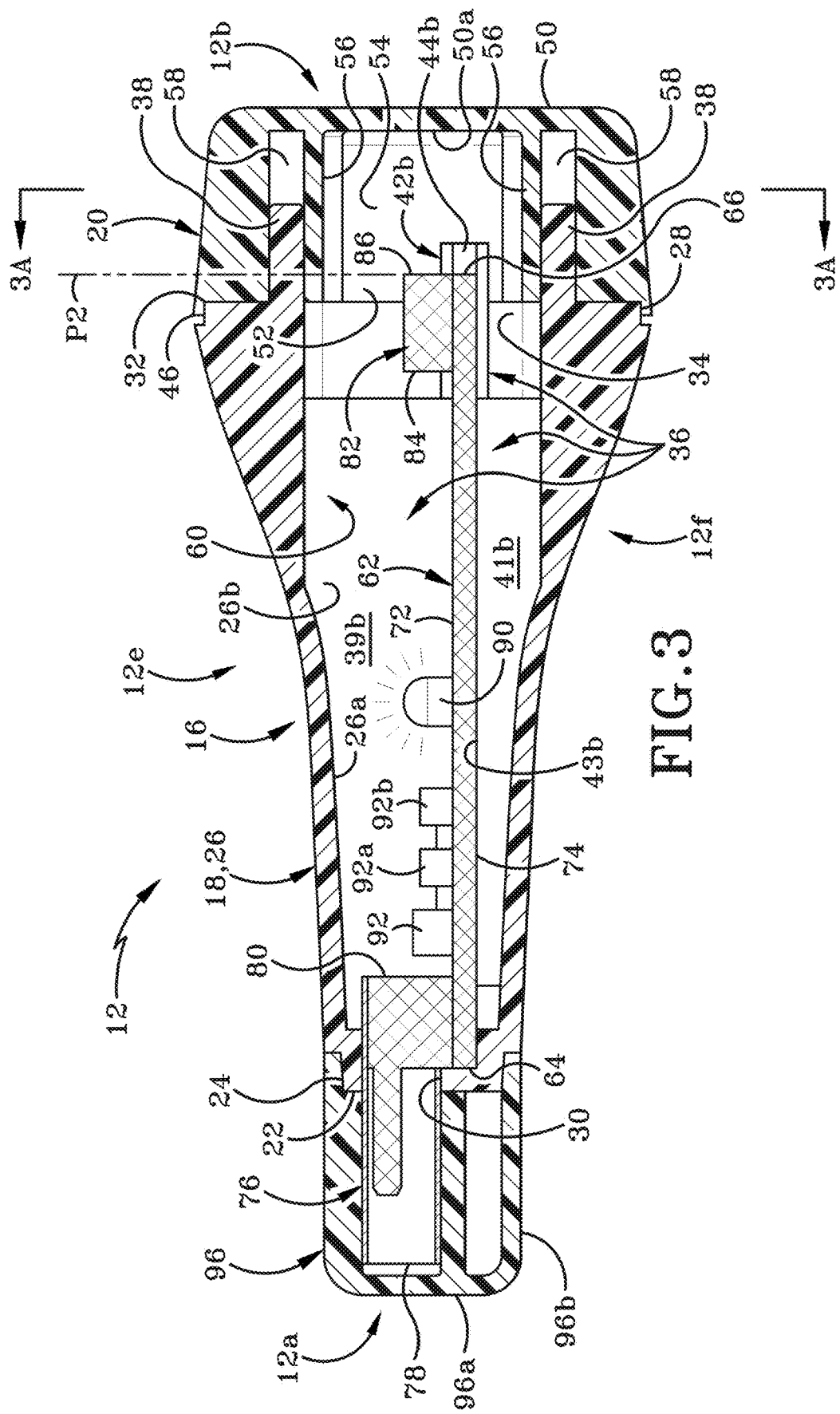
FIG. 3 is a cross section taken along line 3-3 of FIG. 2.

With primary reference to FIG. 1 and FIG. 3, circuit testing system 10 includes a circuit testing module 12, which may also be referred to herein as a module, and a connector mechanism 13. Module 12 includes a first end 12a, a second end 12b, a first side 12c, a second side 12d, a top 12e, and a bottom 12f. First end 12a and second end 12b define a longitudinal direction therebetween. First side 12c and second side 12d define a transverse direction therebetween. Top 12e and bottom 12f define a vertical direction therebetween.

With reference to FIG. 1 through FIG. 5, module 12 includes a housing 16 having a first section 18 and a second section 20. First section 18 includes a front wall 22, a front ledge 24, a central wall 26, and a rear ledge 28 (FIG. 3). Front wall 22 generally faces first end 12a of module 12. Front ledge 24 is positioned longitudinally between front wall 22 and central wall 26. Central wall 26 is positioned longitudinally between front ledge 24 and rear ledge 28. Rear ledge 28 is positioned between central wall 26 and second end 12b of module 12. Central wall 26 tapers longitudinally and transversely from rear ledge 28 to front ledge 24. Central wall 26 includes an inner surface 26a that defines a front interior cavity 26b which extends longitudinally from front wall 22 to rear ledge 28. Front wall 22 defines an opening 30 to front interior cavity 26b and opening 30 faces first end 12a of module 12. Rear ledge 28 includes a rear edge 32 that defines a rear opening 34 to front interior cavity 26b. As shown in FIG. 3, opening 30, front interior cavity 26b, and rear opening 34 are in communication with one another.

Figure 3A:
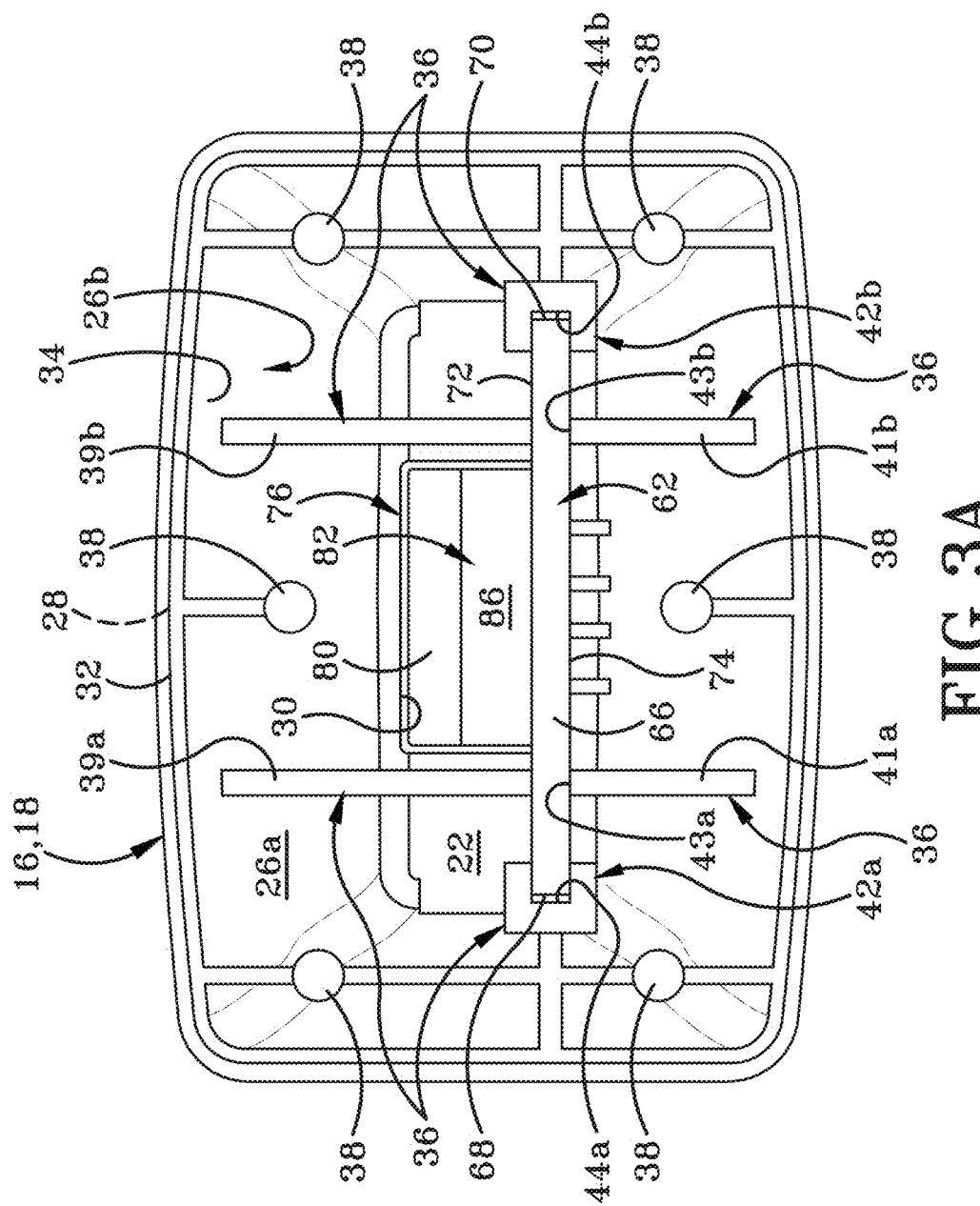
FIG. 3A is a cross section taken along line 3A-3A of FIG. 3 with a portion of the circuit testing module removed.

First section 18 of module 12 further includes a support structure 36 and a plurality of projections 38. With primary reference to FIG. 3A, support structure 36 includes a first top wall 39a, a second top wall 39b, a first bottom wall 41a, a second bottom wall 41b, a first elongated generally U-shaped wall 42a, and a second elongated generally U-shaped wall 42b, each of which is received in the front interior cavity 26b. First top wall 39a is spaced a distance away from first bottom wall 41a. First top wall 39a and first bottom wall 41a define a first space 43a extending longitudinally within front interior cavity 26b. First U-shaped wall 42a extends longitudinally within front interior cavity 26b between first end 12a of module 12 and second end 12b of module 12 and between first side 12c of module and first top wall 39a of support structure 36. First U-shaped wall 42a defines a first groove 44a that extends longitudinally between ends of first U-shaped wall 42a. Second top wall 39b is spaced a distance away from second bottom wall 41b. Second top wall 39b and second bottom wall 41b define a second space 43b extending longitudinally within front interior cavity 26b. Second U-shaped wall 42b extends longitudinally within front interior cavity 26b between first end 12a of module 12 and second end 12b of module 12 and between second side 12d of module and second top wall 39b of support structure 36. Second U-shaped wall 42b defines a second groove 44b that extends longitudinally between ends of second U-shaped wall 42b.

With continued reference to FIG. 3 and FIG. 5, a plurality of projections 38 is operably engaged with rear ledge 28 and extends outwardly away from rear ledge 28. The plurality of projections 38 is operably engaged with second section 20 as more fully described below.

With continued reference to FIG. 3 and FIG. 5, second section 20 includes a front edge 46, an exterior wall 48, and a rear wall 50. Front edge 46 generally faces towards first end 12a of module 12. Exterior wall 48 is positioned longitudinally between front edge 46 and rear wall 50. Exterior wall 48 includes an inner surface 48a and rear wall 50 includes an inner surface 50a. Inner surface 48a and inner surface 50a define a rear interior cavity 54 which extends longitudinally from front edge 46 to rear wall 50. Front edge 46 defines an opening 52 to rear interior cavity 54 and the opening 52 faces first end 12a of module 12.

With continued reference to FIG. 3 and FIG. 5, second section 20 further includes a plurality of receiving members 56 that extend forwardly from inner surface 50a of rear wall 50. Each of the plurality of receiving members 56 defines a recess 58 therein that is sized to releasably receive projections 38 of first section 18 therein when first section 18 and second section 20 are engaged with each other as more fully described below. In one example, a forward end of each of the plurality of receiving members 56 is substantially flush with a first vertical plane P1 defined by front edge 46.

First section 18 and second section 20 are operably engaged with one another by releasably engaging rear ledge 28 of first section 18 with front edge 46 of second section 20 and by releasably engaging projections 38 of first section 18 within recesses 58 of receiving members 56 of second section 20. When first section 18 is operably engaged with second section 20, front interior cavity 26b and rear interior cavity 54 are placed in communication with each other and form an interior space 60 (FIG. 3) that extends from inner surface 50a of rear wall 50 to the opening 30 in front wall 22.

With continued reference to FIG. 3 and FIG. 5, module 12 further includes a printed circuit board (PCB) 62 provided within interior space 60. PCB 62 includes a first end 64, a second end 66, a first side 68, a second side 70, a top surface 72, and a bottom surface 74. Top surface 72 and bottom surface 74 are generally planar and bounded by first end 64, second end 66, first side 68 and second side 70 (FIG. 5). PCB 62 mechanically supports and electrically connects various electronic components within module 12 as further described below. PCB 62 further includes circuitry configured to receive power through the USB adapter 14 from a power source and deliver that power to the various electronic components. With primary reference to FIG. 1 through FIG. 5, and as stated above, first section 18 and second section 20 are operably engaged with one another by releasably engaging rear ledge 28 of first section 18 with front edge 46 of second section 20 and by releasably engaging projections 38 of first section 18 within recesses 58 of receiving members 56 of second section 20. When first section 18 is operably engaged with second section 20, front interior cavity 26b and rear interior cavity 54 form interior space 60. PCB 62 is provided within interior space 60 of module 12. With primary reference to FIG. 3A, PCB 62 is supported by support structure 36. More particularly, PCB 62 is received within first space 43a, second space 43b, first groove 44a of first U-shaped wall 42a, and second groove 44b of second U-shaped wall 42b.

With continued reference to FIG. 3 and FIG. 5, module 12 further includes a USB connector 76. USB connector 76 is a male USB connector and includes a first end 78 and a second end 80. USB connector 76 is mounted on PCB 62 proximate first end 64 of PCB 62 and such that a portion of USB connector 76 extends longitudinally forwardly away from first end 64 of PCB 62. Although USB connector 76 has been described as being mounted in a particular orientation and/or configuration to PCB 62, it is to be understood that USB connector 76 may be mounted to PCB 62 in any suitable orientation and/or configuration. Further, USB connector 76 may be mounted to PCB 62 in any suitable manner, such as, for example, soldering USB connector 76 to top surface 72 of PCB 62.

With continued reference to FIG. 3 and FIG. 5, module 12 further includes a communications device 82, such as a WiFi® module, which allows access to a Wi-Fi® network as more fully described below. Stated otherwise, and in one example, communications module 82 is a self-contained WiFi® server. Communications device 82 includes a first end 84 and a second end 86. Communications device 82 may be mounted on PCB 62 such that second end 86 of communications device 82 is flush with a vertical second plane P2 defined by second end 66 of PCB 62. It is to be understood that communications device 82 may be mounted to top surface 72 of PCB 62 in any suitable manner, such as by soldering communications device 82 to top surface 72. Although communications device 82 has been described as being mounted in a particular orientation and/or configuration to PCB 62, it is to be understood that communications device 82 may be mounted to PCB 62 in any suitable orientation and/or configuration. Further, communications device 82 may be mounted to PCB 62 in any suitable manner, such as, for example, soldering communications device 82 to top surface 72 of PCB 62.

In one example, communications device 82 is configured to communicate with a remote electronic device 88 (FIG. 7 and FIG. 8), particularly a Wi-Fi®-enabled device. Electronic device 88 may include but not be limited to a smartphone, a tablet, a laptop, or the like. Communications device 82 is configured to communicate with electronic device 88 via a WiFi® connection as more fully described below. Further, although communications module 82 has been described as being a WiFi® module, it is to be entirely understood that communications device 82 may be configured to operably communicate with remote electronic device 88 via any suitable wireless data communication protocols, including, but not limited to, WI-FI DIRECT®, BLUETOOTH®, ZIGBEE®, infrared, Worldwide Interoperability for Microwave Access) (WIMAX®, Long Term Evolution (LTE™), Z-WAVE®, or any other suitable protocols not listed herein. WI-FI DIRECT® is a registered trademark of Wi-Fi Alliance of Austin, Tex. BLUETOOTH® is a registered trademark of Bluetooth SIG, Inc., of Kirkland Wash. ZigBee® is a registered trademark of ZigBee Alliance of San Ramon, Calif. WIMAX® is a registered trademark of WiMAX Forum of Clackamas, Oreg. LTE™ is a trademark owned by the European Telecommunications Standards Institute (ETSI) of Sophia-Antipolis, France. Z-WAVE® is a registered trademark owned by Silicon Laboratories Inc., of Austin, Tex. Further, it is envisioned that communications device 82 may be adapted to accommodate changes in current wireless communication standards not yet known.

With continued reference to FIG. 3 and FIG. 5, module 12 further includes an indicator 90 that alerts the user when activated. Indicator 90 may be a visual indicator, including but not limited to a light source that is visible to the user when illuminated. In other examples, indicator 90 may additionally or alternatively be an audible indicator such as a sound generating mechanism that emits an audible signal which may be heard by the user when activated. Indicator 90 is mounted on top surface 72 of PCB 62 and may be located approximately midway between first end 64, second end 66, first side 68, and second side 70 of PCB 62. In one example, indicator 90 is a light emitting diode (LED) mounted to top surface 72 via soldering. It will be understood, however, that indicator 90 may be any suitable visual indicator or audible indicator mounted to any part of PCB 62 or any other part of module 12 in any suitable manner. In one example, indicator 90 is adapted to alert a user that the electrical circuit is one of energized and non-energized as more fully described below.

Module 12 further includes processor logic 92 that is in operable communication with PCB 62. Processor logic 92 includes at least first circuitry 92a and second circuitry 92b. First circuitry 92a determines whether a power signal is present and is adapted to provide notification whether the power signal is present. Second circuitry 92b establishes wireless communication with the remote electronic device 88 and is adapted to communicate with remote electronic device 88. Processor logic 92 may include other circuitry configured to perform other functions, such as, for example, controlling the indicator 90. "Logic", as used herein, includes but is not limited to hardware, firmware, software and/or combinations of each to perform a function(s) or an action(s), and/or to cause a function or action from another logic, method, and/or system. For example, based on a desired application or needs, logic may include a software controlled microprocessor, discrete logic like a processor (e.g., microprocessor), an application specific integrated circuit (ASIC), a programmed logic device, a memory device containing instructions, an electric device having a memory, or the like. Logic may include one or more gates, combinations of gates, or other circuit components. Logic may also be fully embodied as software. Where multiple logics are described, it may be possible to incorporate the multiple logics into one physical logic. Similarly, where a single logic is described, it may be possible to distribute that single logic between multiple physical logics.

Furthermore, the logic(s) presented herein for accomplishing various methods of the circuit testing system 10 may be directed towards improvements in existing computer-centric or internet-centric technology that may not have previous analog versions. The logic(s) may provide specific functionality directly related to structure that addresses and resolves some problems identified herein. The logic(s) may also provide significantly more advantages to solve these problems by providing an exemplary inventive concept as specific logic structure and concordant functionality of the method and system 10. Furthermore, the logic(s) may also provide specific computer implemented rules that improve on existing technological processes. The logic(s) provided herein extends beyond merely gathering data, analyzing the information, and displaying the results.

With primary reference to FIG. 1, and in one example, connector mechanism 13 is a USB adapter 14. USB adapter 14 includes a first end 14a, a second end 14b, a first side 14c, a second side 14d, a top 14e, and a bottom 14f. Second end 14b defines a USB port 93 configured to receive USB connector 76 that extends outwardly and forwardly beyond front wall 22 of module 12. USB adapter 14 further includes a pair of prongs 94 that extend outwardly from first end 14a of USB adapter 14. Prongs 94 are inserted into recesses in a standard wall outlet to provide power to USB adapter 14 and thereby to module 12 when engaged with USB adapter 14. The prongs 94 shown in the attached figures are illustrative of a prong configuration that is used in North America but should not be considered to limit the scope of the invention. Any configuration of prongs suitable for use in any other country may be provided on USB adapter 14.

In one example, USB adapter 14 is an alternating current (AC) power adapter which converts AC power input provided by an AC power source, such as an AC electrical outlet, into DC current to power PCB 62 and other components of module 12. In one example, USB adapter 14 is a five volt USB power supply adapter; however, USB adapter 14 may be any suitable USB adapter. PCB 62 may be powered by receiving direct current (DC) from USB port 93 when USB connector 76 is operably engaged with USB port 93 and prongs 94 is operably engaged with an electrical connection point, e.g. an electrical wall outlet.

With primary reference to FIG. 1 through FIG. 4, circuit testing system 10 further includes a cap 96. Cap 96 is configured to be releasably engaged with front ledge 24 of first section 18 to cover USB connector 76. Cap 96 includes an end wall 96a and a side wall 96b that bound and define a cavity 96c that is sized to receive USB connector 76 therein. Cap 96 is connected to front ledge 24 of first section 18 via an interference fit connection and is movable between an open position and a closed position. As such, the cap 96 is slightly larger than front ledge 24 of first section 18. Cap 96 is configured to be engaged with module 12 to protect the USB connector 76 from damage when module 12 is not being used as described more fully below. Although the engagement of cap 96 to front ledge 24 has been described as being an interference fit engagement, it is envisioned that any suitable engaging mechanism could be utilized, including, but not limited to, a hinged engagement or a threaded engagement.

Figure 6:
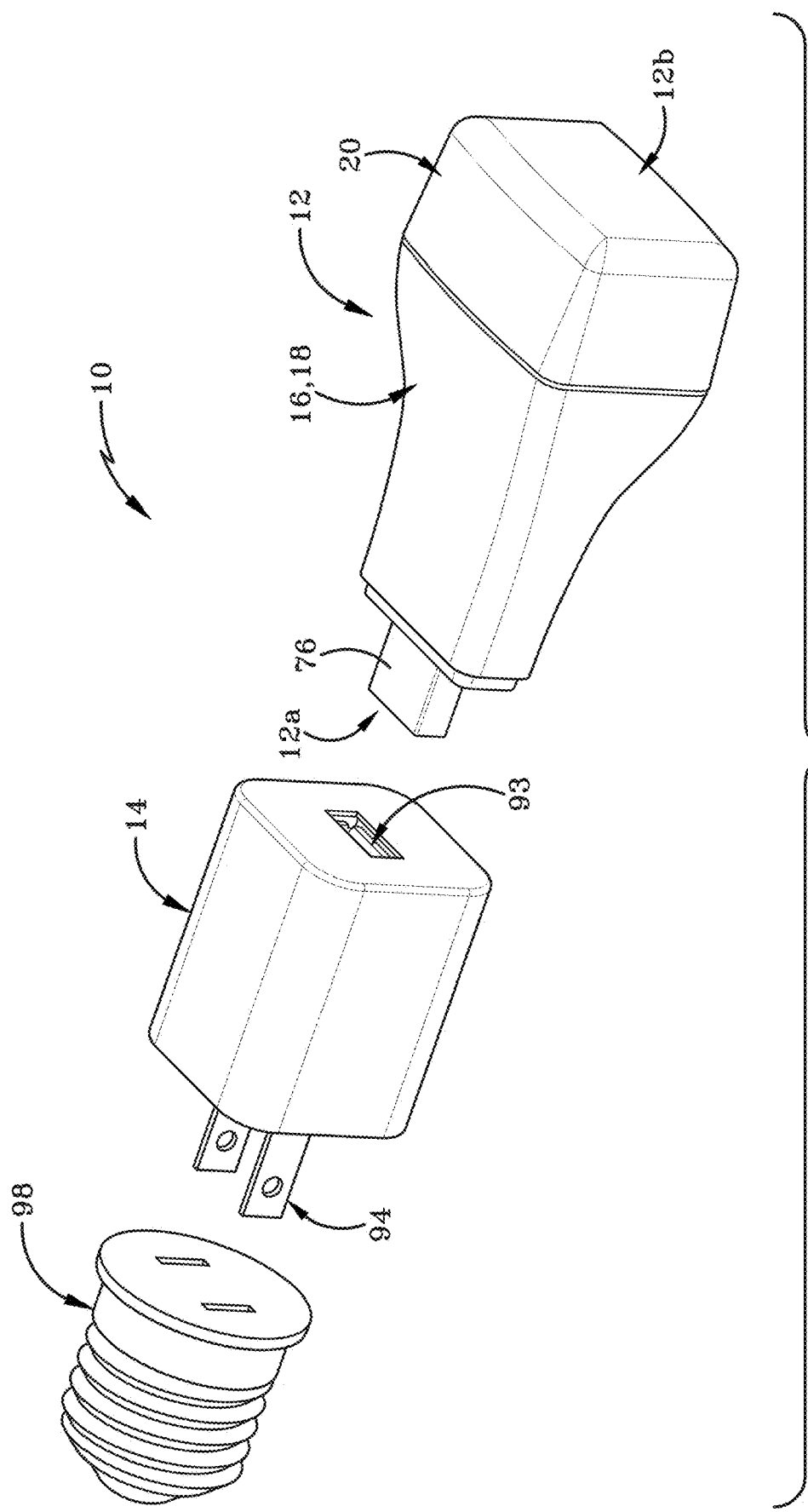
FIG. 6 is an exploded perspective view the circuit testing system including the circuit testing module, the USB adapter and an accessory.
Figure 7:
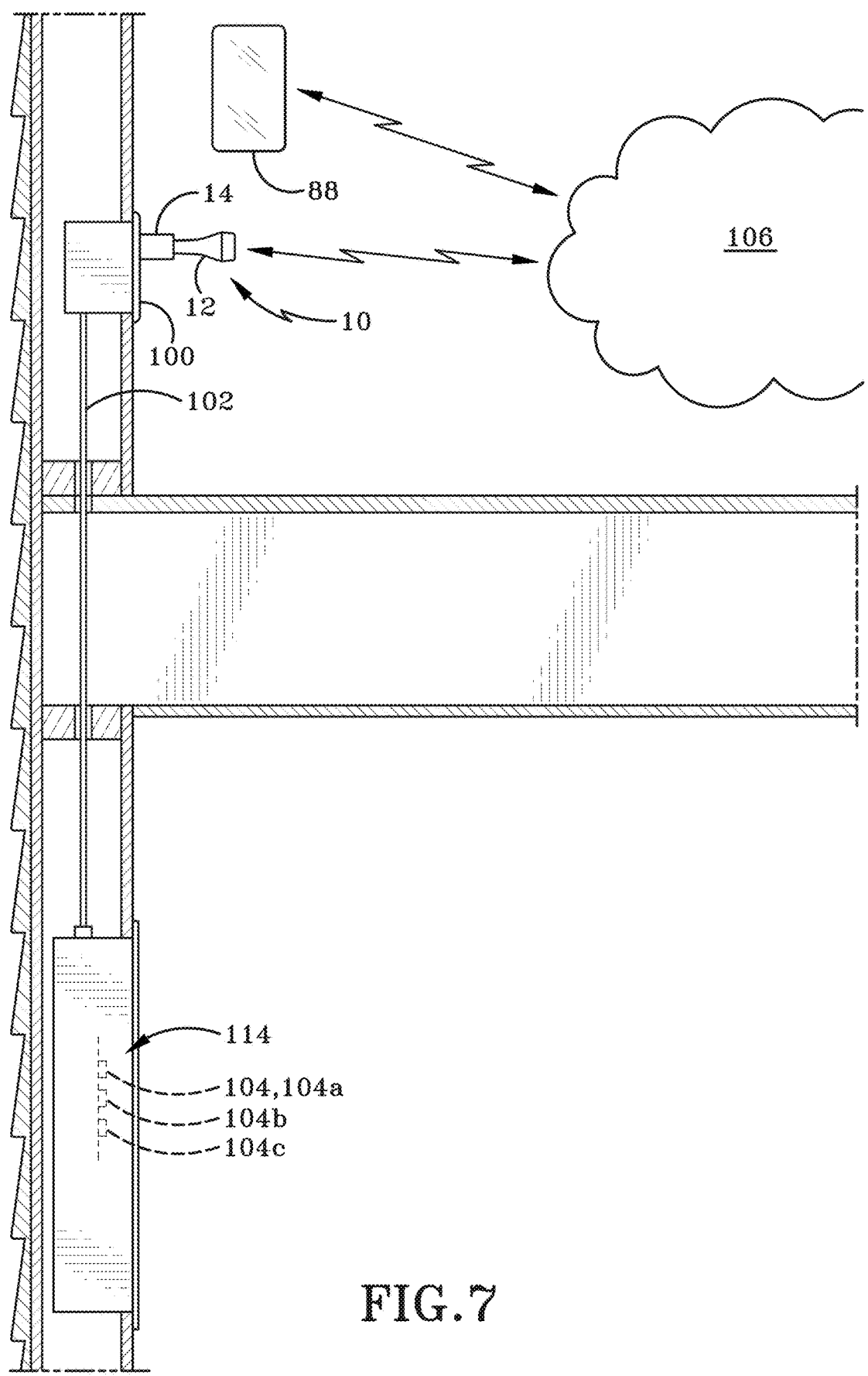
FIG. 7 is a cross section view of an exemplary environment of operation of the circuit testing system.
Figure 8:
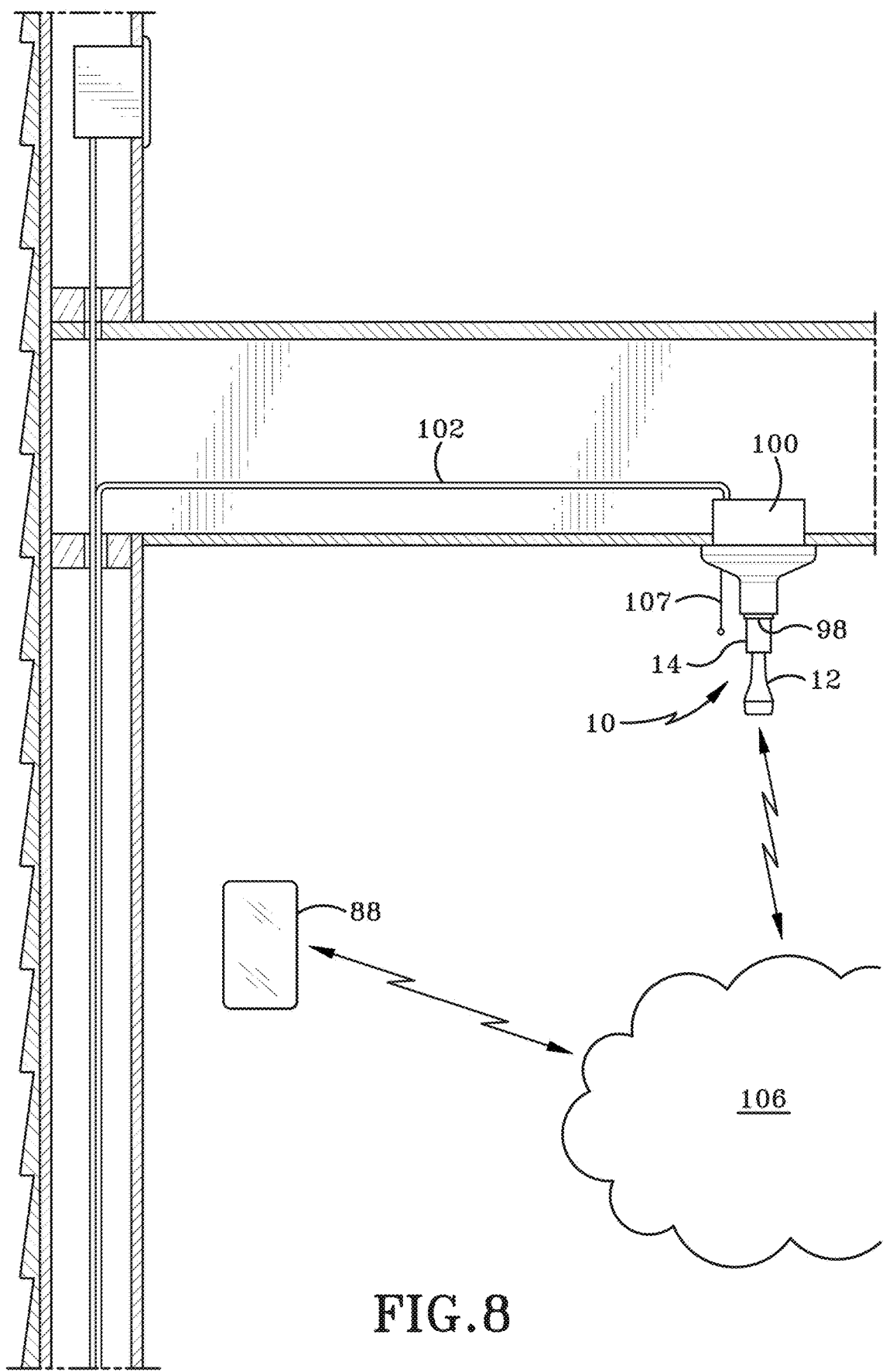
FIG. 8 is another cross section view of an exemplary environment of operation of the circuit testing system.

With primary reference to FIG. 6, circuit testing system 10 may further include an accessory 98, such as, for example, a socket adapter (FIG. 6 and FIG. 8). USB adapter 14 may be operably engaged with accessory 98 as illustrated in FIG. 6 and described later herein. Exemplary socket adapters include an Edison Screw (ES) ES26 standard socket adapter or an ES27 standard socket adapter; however, any suitable socket adapters may be utilized instead of the one illustrated herein. Accessory 98 may be engaged with USB adapter 14 to operably engage module 12 to various electrical connection points 100 (FIG. 7 and FIG. 8), such as, for example, a light socket. For example, and not meant as a limitation, accessory 98 includes a first region adapted to operably engage the accessory 98 to the electrical connection point 100 and a second region that receives the prongs 94 of the USB adapter 14. Although accessory 98 has been described as being a socket adapter, it is to be entirely understood that the accessory 98 may be any suitable accessory, and may be configured to connect to any electrical connection point 100, including, but not limited to, light receptacles, bare or exposed electrical wires or the like. For example, and not meant as a limitation, accessory 98 may, alternatively, be a probe selectively engageable with bare or exposed electrical wires.

Although module 12 has been described as being selectively engageable with USB adapter 14, and is further selectively engageable with accessory 98, it is to be entirely understood that the module 12 and USB adapter 14 or, alternatively, module 12, USB adapter 14 and accessory 98, may be integrally formed as a single monolithic component. Although connector mechanism 13 has been described as being a USB adapter 14, it is to be entirely understood that the connector mechanism 13 may be any suitable connector mechanism 13.

In operation, circuit testing system 10 is utilized to test energized and non-energized electrical circuits 102 to identify which circuit breakers 104 control the various electrical circuits 102 (FIG. 7 and FIG. 8) that terminate in the circuit breakers 104 in an electrical panel 114. In one example, and with primary reference to FIG. 1 and FIG. 7, USB adapter 14 is plugged into electrical connection point 100 via prongs 94 of USB adapter 14 and USB connector 76 of module 12 is plugged into USB port 93 of USB adapter 14. In another example, and with primary reference to FIG. 6 and FIG. 8, accessory 98, such as a socket adapter, is operably engaged with electrical connection point 100, such as a standard light receptacle, USB adapter 14 is operably engaged with accessory 98 via prongs 94 of USB adapter 14, and USB connector 76 of module 12 is plugged into USB port 93 of USB adapter 14. In this latter example, a switch mechanism 107, such as a pull chain operably engaged with electrical connection point 100, is manipulated to an "on" position. Stated otherwise, module 12 is operably engaged with electrical connection point 100 either through USB adapter 14 or through the combination of USB adapter 14 and accessory 98. Once the module is operably engaged with the electrical connection point 100, if need be, the electrical connection point 100 is set to a state where it would normally be energized by the electrical circuit 102 that connects the connection point 100 to the electrical panel 114.

When electrical circuit 102 is energized (i.e. put into a live state by providing electrical power thereto), indicator 90 is activated to alert the user to the fact that the electrical circuit 102 is energized. First circuitry 92a determines whether a power signal is present and is adapted to provide notification whether the power signal is present. For example, in the event indicator 90 is an LED, and electrical circuit 102 operably engaged with electrical connection point 100 is energized, after module 12 is operably engaged with electrical connection point 100, first circuitry 92a determines that the power signal is present and the LED is illuminated. In one example, LED may emit red light, however, any suitable color of light may be emitted by LED.

As stated above, communications device 82 allows operable communication between module 12 and remote electronic device 88 through a wireless internet connection 106, such as a WiFi® wireless connection provided by communications device 82. As such, a user connects remote electronic device 88 to module 12 via communications device 82 and the wireless internet connection 106. In one example, second circuitry 92b establishes wireless communication with remote electronic device 88 and is adapted to communicate with remote electronic device 88. For example, and not meant as a limitation, remote electronic device 88 may be a smartphone. In this example, a user ensures that WiFi® is enabled on the smartphone and opens the associated WiFi® menu on the smartphone. The user utilizes a user interface of the smartphone to scan for nearby WiFi® networks and locate the Wi-Fi® network 106 provided by communications device 82. The wireless internet connection 106 is listed within the Wi-Fi® menu on the smartphone. The user selects the wireless internet connection 106 which connects communications device 82 to the smartphone. In some cases, a wireless internet connection password may be necessary which will be provided to users of the circuit testing system 10.

Figure 9:
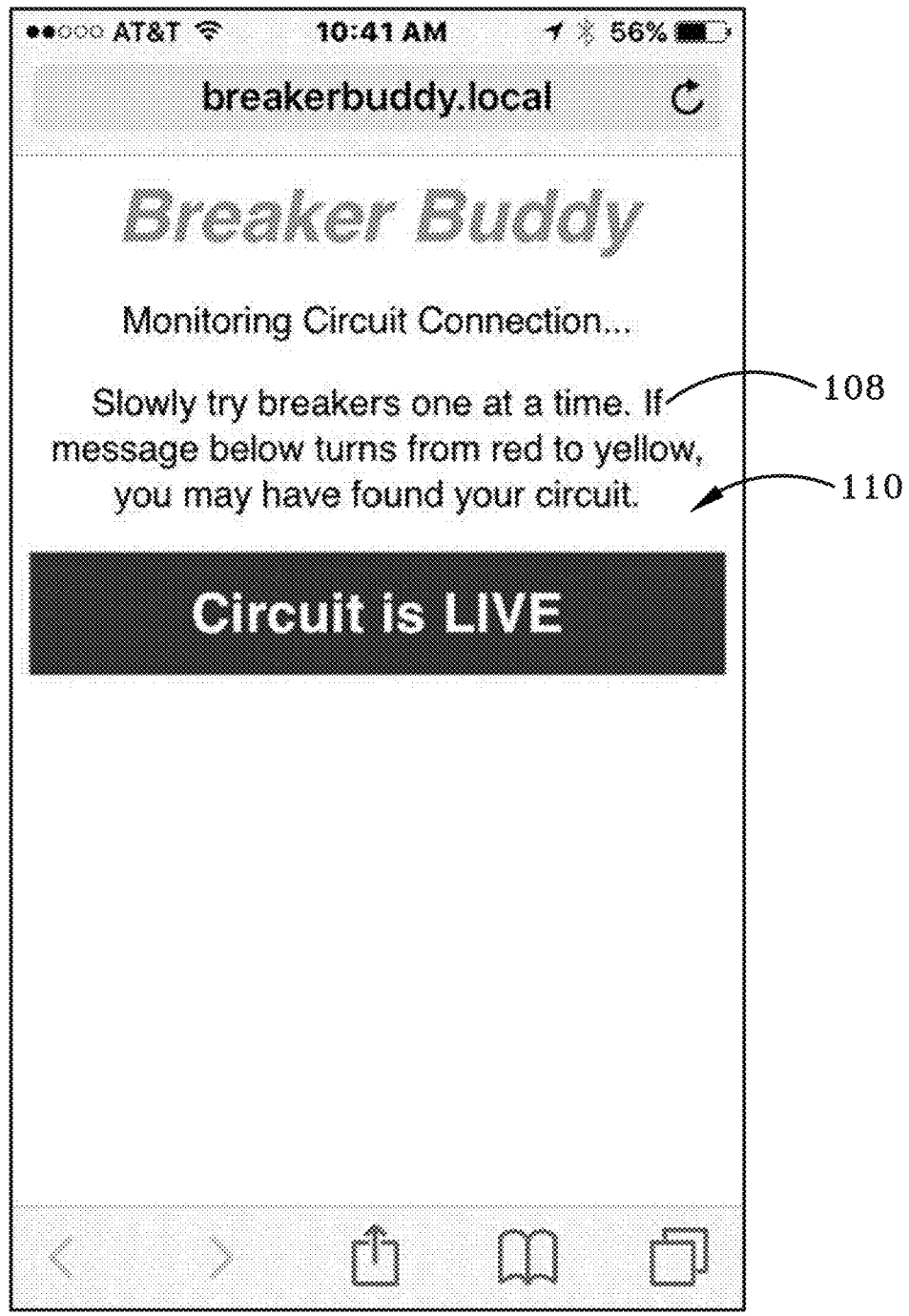
FIG. 9 is a sample webpage with notification indicia.

Once the smartphone is connected to the wireless internet connection 106, module 12 wirelessly sends notification indicia 108 to the smartphone. For example, and not meant as a limitation, the user utilizes the smartphone to open a web browser and the user inputs a URL address. The URL address directs the user to a webpage 110 (FIG. 9) associated with circuit testing system 10. Webpage 110 provides various notification indicia 108. For example, and not meant as a limitation, notification indicia 108 includes information indicating that the electrical circuit 102 is energized, that an interruption has been detected, or that the circuit breaker 104 associated with the electrical circuit 102 has been identified or there has been an interruption in wireless connection between the smartphone and communications device 82. Webpage 110 is an exemplary webpage having notification indicia 108 indicating that the electrical circuit 102 is energized.

In one example, webpage 110 may be automatically refreshed at a predetermined rate. For example, webpage 110 may be automatically refreshed every one second, two seconds, three seconds, five seconds, or any other suitable time period.

Figure 10:
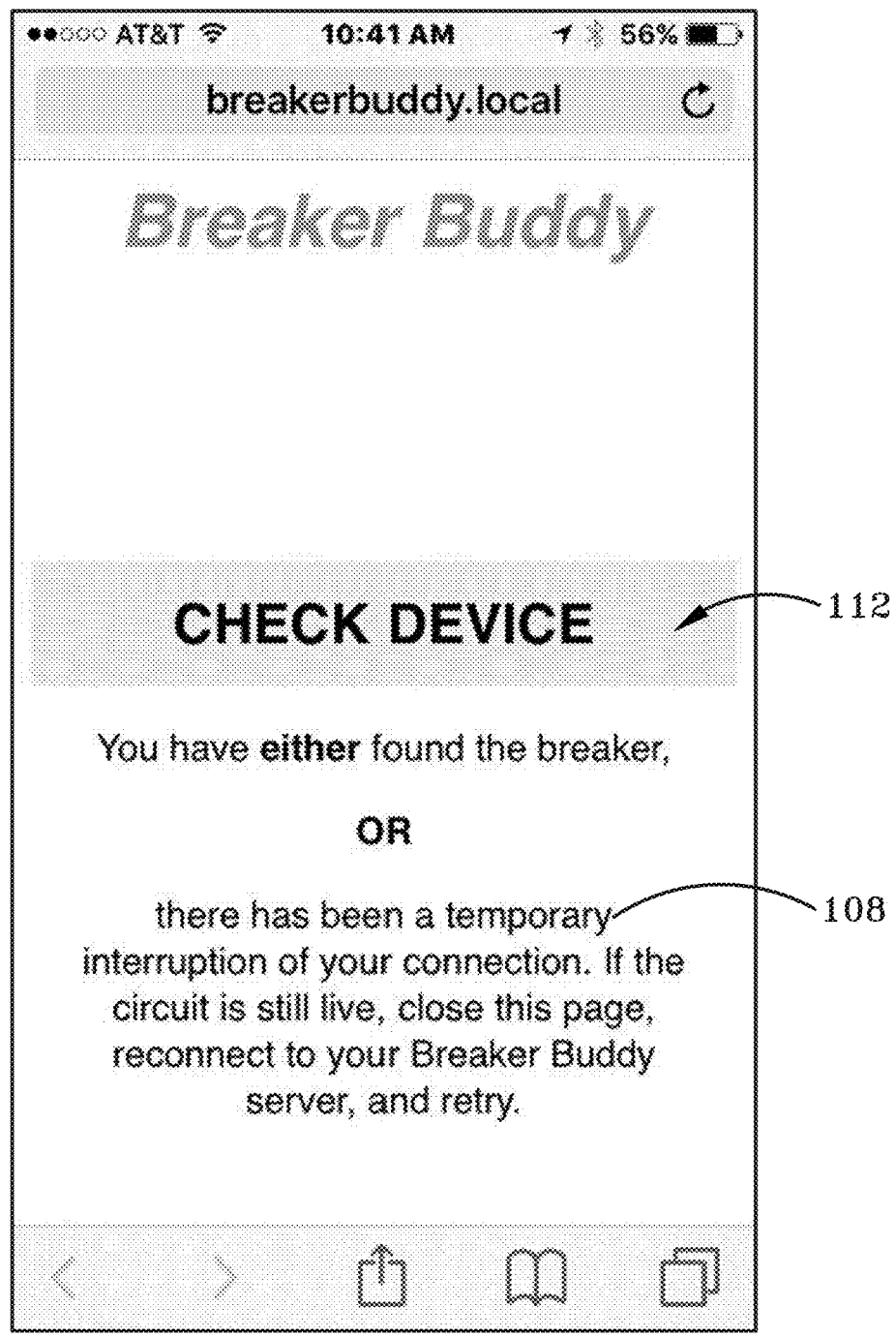
FIG. 10 is another sample webpage with notification indicia.

Web browser of smartphone displays webpage 110 having notification indicia 108 until electrical circuit 102 is non-energized at which time module 12 may wirelessly send notification indicia 108 to remote electronic device 88 indicating that the user may have identified the circuit breaker 104 associated with electrical circuit 102. For example, and not meant as a limitation, web browser of smartphone may be directed to a webpage 112 (FIG. 10) that provides notification indicia 108 indicating that electrical circuit 102 is non-energized and that the operator may have located electrical circuit 102 associated with circuit breaker 104 of an electrical panel 114 or that the smartphone has lost its connection with communications device 82 of module 12.

Webpage 112 is displayed when there is a loss of power to module 12 and/or when the smartphone loses its connection to the wireless internet connection 106. In the event the user observes webpage 112, the user may then check module 12 to determine if indicator 90 is still activated (i.e., the LED is on). If indicator 90 is still activated, electrical circuit 102 may still be energized and further action may be necessary such as utilizing suitable circuit testing equipment to ensure that electrical circuit 102 is not energized before any work is performed.

As such, after the user's smartphone displays the webpage 110 indicating that electrical circuit 102 is energized, the user may stand next to the electrical panel 114 remote from the module 12 and the electrical connection point with which module 12 is engaged, and sequentially turn off circuit breakers 104 of the electrical panel 114. The circuit breakers may be turned off one at a time at a predetermined rate until a circuit breaker that controls electrical circuit 102 is located. For example, and not meant as a limitation, the user may turn off a first circuit breaker 104a and wait a predetermined period of time, such as five seconds, to receive notification if the electrical circuit 102 with which module 12 is engaged is energized or is non-energized. In other words, the user awaits notification as to whether or not the electrical circuit 102 associated with the first circuit breaker 104a has been opened by switching off the first circuit breaker 104a and so electricity is no longer flowing through that electrical circuit 102 or if moving the first circuit breaker 104a to the off position had no effect on the electrical circuit 102 with which module 12 is engaged. After turning off the first circuit breaker 104a, notification indicia 108 may indicate that electrical circuit 102 is energized, i.e., the electrical circuit 102 is still live and electricity is flowing therethrough. If the electrical circuit 102 is energized, this means that the first circuit breaker 104a is not part of the electrical circuit 102 that includes the electrical connection point with which the module 12 is engaged.

If after waiting the predetermined period of time, notification indicia 108 still indicates that electrical circuit 102 is energized, the user may turn the first circuit breaker 104a back on and then turn off a different second circuit breaker 104b. The user will again wait for the predetermined period of time to expire. If the second circuit breaker 104b remains energized, then the user knows that second circuit breaker 104b is also not part of the electrical circuit 102 with which module 12 is engaged at a remote location. The user will then switch the second circuit breaker 104b back on and will move to turn off a third circuit breaker 104c. The user repeats this process until the smartphone displays notification indicia 108 indicating that electrical circuit 102 is non-energized. In other words, the electrical circuit 102 with which the module 12 is engaged no longer has electricity flowing through it because the user has switched off the correct circuit breaker 104 associated with electrical circuit 102. It is now safe for the user to perform electrical work at the electrical connection point 100 with which module 12 is engaged because the electrical circuit 102 is no longer live.

It is to be understood that notification indicia 108 may also contain safety information and may be conveyed to the user via the web page on the remote electronic device 88. For example, and not meant as a limitation, notification indicia 108 may include information indicating that only certified electricians should perform work on electrical circuits and that the user should check electrical circuits with a multimeter or electrical socket tester to confirm whether electrical circuits are energized or non-energized.

Figure 11:
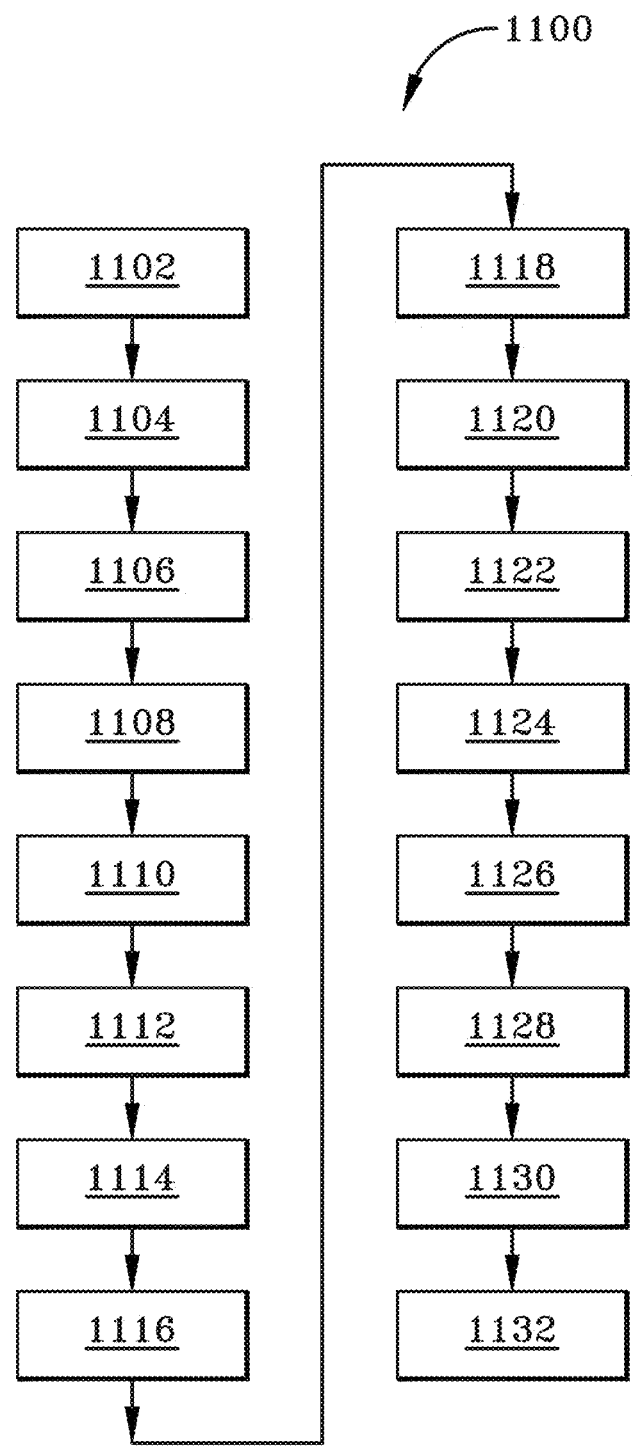
FIG. 11 is a flow chart of one method or process in accordance with the present disclosure.

FIG. 11 depicts an exemplary method of identifying a circuit breaker 104 associated with an electrical circuit 102 in accordance with one aspect of the present disclosure and is generally referred to as 1100. The method 1100 includes providing a circuit testing system 10 including a circuit testing module 12, which is shown generally at 1102. The method 1100 includes operably engaging the circuit testing module 12 with an electrical connection point 100 of an electrical circuit 102, which is shown generally at 1104. The electrical circuit 102 includes one of a plurality of circuit breakers 104 provided in an electrical panel 114. The method 1100 includes determining that the electrical circuit 102 is energized, which is shown generally at 1106. The method 1100 includes wirelessly linking the circuit testing module 12 with a remote electronic device 88, which is shown generally at 1108. The method 1100 includes wirelessly sending notification indicia 108 from the circuit testing module 12 to the remote electronic device 88 that indicates that the electrical circuit 102 is energized, which is shown generally at 1110. The method 1100 includes sequentially turning off each circuit breaker 104 of the plurality of circuit breakers 104 until the notification indicia 108 sent from the circuit testing module 12 to the remote electronic device 88 indicates that the electrical circuit 102 is non-energized, which is shown generally at 1112. The method 1100 includes identifying the circuit breaker 104 associated with the electrical connection point 100 as the circuit breaker 104 that is turned off when the electrical circuit 102 is non-energized, which is shown generally at 1114.

In one example, the method 1100 further includes operably engaging a USB adapter 14 to the module 12; and operably engaging the USB adapter 14 to the electrical connection point 100, which is shown generally at 1116. In another example, the method 1100 further includes operably engaging a USB adapter 14 to the circuit testing module 12, operably engaging an accessory 98 to the USB adapter 14, and operably engaging the accessory 98 to the electrical connection point 100, which is shown generally at 1118. The method 1100 further includes activating an indicator 90 on the circuit testing system 10 when the electrical circuit 102 is energized, which is shown generally at 1120. The method 1100 further includes deactivating the indicator 90 on the circuit testing system 10 when the electric circuit 102 is non-energized, which is shown generally at 1122. The method 1100 further includes opening a webpage 110, 112 of the circuit testing system 10 on the remote electronic device 88, which is shown generally at 1124. The method 1100 further includes displaying the notification indicia 108 on the webpage 110, 112, which is shown generally at 1126. The method 1100 further includes providing a wireless network connection 106 from the circuit testing module 12, which is shown generally at 1128. The method 1100 further includes wirelessly linking the remote electronic device 88 to the wireless network connection 106, which is shown generally at 1130. The method 1100 further includes entering a web address, which is a Uniform Resource Locator (URL), on the remote electronic device 88, opening a web page 110, 112 linked to the web address, and receiving the notification indicia 108 on the web page 110, 112, which is shown generally at 1132.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one." The phrase "and/or," as used herein in the specification and in the claims (if at all), should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc. As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

An embodiment is an implementation or example of the present disclosure. Reference in the specification to "an embodiment," "one embodiment," "some embodiments," "one particular embodiment," or "other embodiments," or the like, means that a particular feature, structure, or characteristic described in engagement with the embodiments is included in at least some embodiments, but not necessarily all embodiments, of the invention. The various appearances "an embodiment," "one embodiment," "some embodiments," "one particular embodiment," or "other embodiments," or the like, are not necessarily all referring to the same embodiments.

Additionally, any method of performing the present disclosure may occur in a sequence different than those described herein. Accordingly, no sequence of the method should be read as a limitation unless explicitly stated. It is recognizable that performing some of the steps of the method in a different order could achieve a similar result.

In the foregoing description, certain terms have been used for brevity, clearness, and understanding. No unnecessary limitations are to be implied therefrom beyond the requirement of the prior art because such terms are used for descriptive purposes and are intended to be broadly construed.

Moreover, the description and illustration of various embodiments of the disclosure are examples and the disclosure is not limited to the exact details shown or described.

The invention claimed is:

1. A method of identifying a circuit breaker associated with an electrical circuit, said method comprising:
providing a circuit testing system including a circuit testing module;
operably engaging the circuit testing module with an electrical connection point of an electrical circuit, wherein the electrical circuit includes one of a plurality of circuit breakers provided in an electrical panel;
operably engaging a Universal Serial Bus (USB) adapter to the circuit testing module;

operably engaging the USB adapter to the electrical connection point;

determining that the electrical circuit is energized;

wirelessly linking the circuit testing module with a remote electronic device;

wirelessly sending notification indicia from the circuit testing module to the remote electronic device that indicates that the electrical circuit is energized;

sequentially turning off each circuit breaker of the plurality of circuit breakers until the notification indicia sent from the circuit testing module to the remote electronic device indicates that the electrical circuit is non-energized; and identifying the circuit breaker associated with the electrical connection point as the circuit breaker that is turned off when the electrical circuit is non-energized.

2. A method of identifying a circuit breaker associated with an electrical circuit, said method comprising:

providing a circuit testing system including a circuit testing module;

operably engaging the circuit testing module with an electrical connection point of an electrical circuit, wherein the electrical circuit includes one of a plurality of circuit breakers provided in an electrical panel;

operably engaging a Universal Serial Bus (USB) adapter to the circuit testing module;

operably engaging an accessory to the USB adapter;

operably engaging the accessory to the electrical connection point;

determining that the electrical circuit is energized;

wirelessly linking the circuit testing module with a remote electronic device;

wirelessly sending notification indicia from the circuit testing module to the remote electronic device that indicates that the electrical circuit is energized;

sequentially turning off each circuit breaker of the plurality of circuit breakers until the notification indicia sent from the circuit testing module to the remote electronic device indicates that the electrical circuit is non-energized; and identifying the circuit breaker associated with the electrical connection point as the circuit breaker that is turned off when the electrical circuit is non-energized.

3. The method of claim 2, further comprising:

activating an indicator on the circuit testing system when the electrical circuit is energized.

4. The method of claim 2, further comprising:

deactivating an indicator on the circuit testing system when the electric circuit is non-energized.

5. The method of claim 2, further comprising:

opening a webpage of the circuit testing system on the remote electronic device; and displaying the notification indicia on the webpage.

6. The method of claim 2, further comprising:

providing a wireless network connection from the circuit testing module; and wirelessly linking the remote electronic device to the wireless network connection.

7. The method of claim 6, further comprising:

entering a web address on the remote electronic device;

opening a web page linked to the web address; and receiving the notification indicia on the web page.

\* \* \* \* \*